(12) United States Patent
Setsompop et al.

(10) Patent No.: US 8,085,044 B2
(45) Date of Patent: Dec. 27, 2011

(54) METHOD FOR PRODUCING SPECTRAL-SPATIAL PARALLEL RF EXCITATION PULSES FOR MAGNETIC RESONANCE IMAGING

(75) Inventors: Kawin Setsompop, Cambridge, MA (US); Borjan A. Gagoski, Cambridge, MA (US); Elfar Adalsteinsson, Belmont, MA (US); Vijayanand Alagappan, Streetsboro, OH (US); Lawrence L Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 161 days.

(21) Appl. No.: 12/544,714

(22) Filed: Aug. 20, 2009

(65) Prior Publication Data
US 2010/0156411 A1    Jun. 24, 2010

Related U.S. Application Data

(60) Provisional application No. 61/090,256, filed on Aug. 20, 2008.

(51) Int. Cl.
*G01V 3/00* (2006.01)
(52) U.S. Cl. .................................................... 324/309
(58) Field of Classification Search .......... 324/300–322; 600/407, 410, 419–422; 382/128, 131
See application file for complete search history.

(56) References Cited

U.S. PATENT DOCUMENTS

| | | | | |
|---|---|---|---|---|
| 6,188,219 B1 * | 2/2001 | Reeder et al. | ................. | 324/307 |
| 7,368,910 B2 * | 5/2008 | Bammer et al. | .............. | 324/306 |
| 7,466,131 B1 * | 12/2008 | Xu et al. | ....................... | 324/318 |
| 7,800,368 B2 * | 9/2010 | Vaughan et al. | .............. | 324/318 |
| 7,843,195 B2 * | 11/2010 | Ruhm | .......................... | 324/309 |
| 2009/0256570 A1 * | 10/2009 | Zelinski et al. | ............... | 324/314 |
| 2010/0296714 A1 * | 11/2010 | Schmainda et al. | .......... | 382/131 |

* cited by examiner

*Primary Examiner* — Brij Shrivastav
(74) *Attorney, Agent, or Firm* — Quarles & Brady LLP

(57) ABSTRACT

A method for producing a spatially and spectrally selective radiofrequency ("RF") excitation pulse includes establishing a desired spatial RF excitation pattern and establishing a desired spectral RF excitation pattern. The method also includes estimating an RF transmission profile map indicative of the transmission characteristics of an RF coil and determining, from the desired spatial and spectral excitation patterns and the estimated RF transmission profile map, at least one magnetic field gradient waveform indicative of locations in k-space to which RF energy is to be deposited. The method further includes determining, from the established spatial and spectral excitation patterns, the estimated RF transmission profile map, and the determined at least one gradient waveform, at least one RF excitation pulse waveform that will produce the desired spatial and spectral excitation patterns.

16 Claims, 3 Drawing Sheets

METHOD FOR PRODUCING SPECTRAL-SPATIAL PARALLEL RF EXCITATION PULSES FOR MAGNETIC RESONANCE IMAGING

CROSS-REFERENCE TO RELATED APPLICATIONS

This application claims the benefit of U.S. Provisional patent application Ser. No. 61/090,256 filed on Aug,. 20, 2008, and entitled "Method for Producing Spectral-Spatial Parallel RF Excitation Pulses for Magnetic Resonance Imaging."

STATEMENT REGARDING FEDERALLY SPONSORED RESEARCH

This invention was made with United States government support awarded by the following agency: National Institute of Health R01EB006847, R01EB000790, R01EB007942, and P41RR14075. The United States government has certain rights in this invention.

BACKGROUND OF THE INVENTION

The field of the invention is magnetic resonance imaging ("MRI") and magnetic resonance spectroscopy ("MRS") methods and systems. More particularly, the invention relates to the generation of spatially and spectrally-tailored excitation pulses for parallel transmission MR systems.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently used to produce medical images require many minutes to acquire the necessary data. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel imaging." Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils. Thus the use of multiple receiver coils acts to multiply imaging speed, without increasing gradient switching rates or RF power.

Most MRI scanners use a single-channel RF excitation coil to tip the spin magnetization away from its equilibrium state and initiate a measurement cycle. Usually, an RF excitation pulse is used to excite either all of the spins inside the excitation coil (non-selective excitation), a single slice through the subject (slice-selective excitation), or within only a specific region, such as, a small cube (3-D spatially-selective excitation). In spatially-selective, spatially-tailored excitation, the RF pulse is played out in the presence of gradient waveforms that impart a gradient onto the main magnetic field of the MRI system, which is instrumental in the spatial and selective excitation process. In general, the gradient field may be viewed as causing the traversal of a curve in excitation k-space, a path that may proceed through all three dimensions of k-space ($k_x$, $k_y$, and $k_z$), which under certain assumptions is essentially a 3D Fourier domain. During this traversal of excitation k-space, the energy of the RF pulse being played in conjunction with the gradient waveforms may be viewed as depositing RF energy along this k-space excitation trajectory curve. The RF pulse thus produces an excitation that modulates (in phase, in amplitude, or both) as a function of position ($k_x$, $k_y$, and $k_z$) in excitation k-space. The resulting excitation is often closely related to the inverse Fourier transform of this deposited energy.

For example, in a typical slice-selective RF pulse, a constant gradient field is applied in the z-direction while an RF pulse shaped like a sine cardinal ("sinc") function is transmitted through the MRI system's single excitation coil. In this instance, the gradient field causes the RF pulse energy to be deposited along a single line (a "spoke") in the $k_z$-direction of excitation k-space, that is, a line through the k-space position $(0,0,k_z)$. This sinc-like deposition in $k_z$ excites only those magnetic spins within a thin slice of tissue due to the Fourier relationship between energy deposited in excitation k-space and the flip angle of the resulting magnetization. In short, the magnetization that results from this typical RF pulse is a constant degree of excitation within the slice and no excitation out of the slice.

Recent work has extended this slice-selective concept to all three spatial dimensions, in which not only a thin slice is excited, but a particular pattern within the slice itself is excited. These "spatially-tailored" excitations in 2D and 3D require lengthy application of the RF excitation and associated gradients. A recent method, termed "parallel transmission" (and sometimes referred to as "parallel excitation"), exploits variations among the different spatial profiles of a multi-element RF coil array. This permits sub-sampling of the gradient trajectory needed to achieve the spatially-tailored excitation and this method has been shown in many cases to dramatically speed up, or shorten, the corresponding RF pulse.

This "acceleration" of the spatially-tailored RF excitation process makes the pulse short enough in duration to be clinically useful. Accelerations of 4 to 6 fold have been achieved via an 8 channel transmit system as disclosed by K. Setsompop, et al., in "Parallel RF Transmission with Eight Channels at 3 Tesla," *Magnetic Resonance in Medicine;* 2006, 56:1163-1171. This acceleration enables several important applications, including flexibly shaped excitation volumes and mitigation of RF field inhomogeneity at high field for slice or slab-selective pulses. A number of methods have been proposed for the design of the RF and gradient waveforms for parallel excitation, such as those disclosed, for example, by U. Katscher, et al., in "Transmit SENSE," *Magnetic Resonance in Medicine;* 2003, 49:144-150; by Y. Zhu in "Parallel Excitation with an Array of Transmit Coils," *Magnetic Resonance in Medicine;* 2004, 51:775-784; by M. Griswold, et al., in "Autocalibrated Accelerated Parallel Excitation (Transmit-GRAPPA)," *Proceedings of the 13th Annual Meeting of ISMRM;* 2005, 2435; and by W. Grissom, et al., in "Spatial Domain Method for the Design of RF Pulses in Multicoil Parallel Excitation," *Magnetic Resonance in Medicine;* 2006, 56:620-629.

Successful implementations have been demonstrated on multi-channel hardware, including those described by P. Ullmann, et al., in "Experimental Analysis of Parallel Excitation Using Dedicated Coil Setups and Simultaneous RF Transmission on Multiple Channels," *Magnetic Resonance in Medicine;* 2005, 54:994-1001; by D. Xu, et al., in "A Noniterative Method to Design Large-Tip-Angle Multidimensional Spatially-Selective Radio Frequency Pulses for Parallel Transmission," *Magnetic Resonance in Medicine;* 2007, 58:326-334; and by P. Vernickel, et al., in "Eight-Channel Transmit/Receive Body MRI Coil at 3T," *Magnetic Resonance in Medicine;* 2007, 58:381-389.

Spatially-tailored excitations using parallel transmission methods are designed to provide the prescribed excitation pattern at the Larmor frequency of a specific spin species; however, proton chemical shift imaging requires that the prescribed excitation pattern be produced across a specified spectrum of frequencies. This requirement becomes even more challenging when performed at high $B_0$ field strengths because the spectral bandwidth is expanded at these higher magnetic field strengths. Indeed, the spreading out of the MR signals across a wider spectrum is one of the advantages of performing proton chemical shift imaging at higher $B_0$ strengths. Yet, this additional bandwidth constraint presents a challenge for current design methods which are aimed at water-only RF excitation. For example, spatially-tailored RF excitation pulses based on small-flip-angle excitations with spoke-based k-space trajectories can efficiently mitigate large $B_1^+$ inhomogeneities at high $B_0$ field strengths by using relatively short slice-selective excitation pulses. Unfortunately, such pulses often exhibit a narrow-band off-resonance response and are, therefore, not suitable for applications that require $B_1^+$ mitigation over a large spectral bandwidth.

It would therefore be desirable to provide a method for producing RF excitation pulses in high field MRI having both a desired spatial extent and spectral bandwidth. With such a method, it would be possible to reliably operate an MRI system at high $B_0$ strength for those applications that require $B_1^+$ mitigation over a large spectral bandwidth and spatially selective excitation over a limited range of spectral frequency. Moreover, such a method would also provide the ability to produce RF excitation at a certain spectral frequency while producing substantially no excitation at another spectral frequency.

SUMMARY OF THE INVENTION

The present invention overcomes the aforementioned drawbacks by providing a method for producing an RF excitation pulse using parallel transmission techniques in which both the spatial excitation pattern and the spectral bandwidth is prescribed. More specifically, the present invention provides a method for designing a spatial-spectral RF excitation pattern with either a single RF transmission coil, or a parallel RF transmission coil array. The desired patterns of spatial and spectral excitation are established prior to the RF excitation pulse design and $B_1^+$ maps are estimated so that the transmission characteristics of the RF coil employed are known. From the established excitation patterns and the estimated $B_1^+$ maps, gradient waveforms are determined. These gradient waveforms indicate the positions in k-space to which RF energy should be deposited in order to produce the desired excitation. Subsequently, the desired excitation patterns and gradient waveforms are utilized to determine the RF excitation waveforms that, when played out in the presence of the determined gradient waveforms, will produce transverse magnetization in accordance with the established patterns of excitation—both in spatial extent and spectral response.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

The following definitions and terms are provided to clarify the description of the present invention and to guide those of ordinary skill in the art in the practice of the present invention:

$r=[r_x, r_y, r_z]^t$ is a spatial location;

$G(t)=[G_x(t), G_y(t), G_z(t)]^T$ is a set of gradient waveforms $G_x(t)$, $G_y(t)$, and $G_z(t)$; and $k(t)=[k_x(t), k_y(t), k_z(t)]^T$ is a k-space trajectory.

Figure 1:
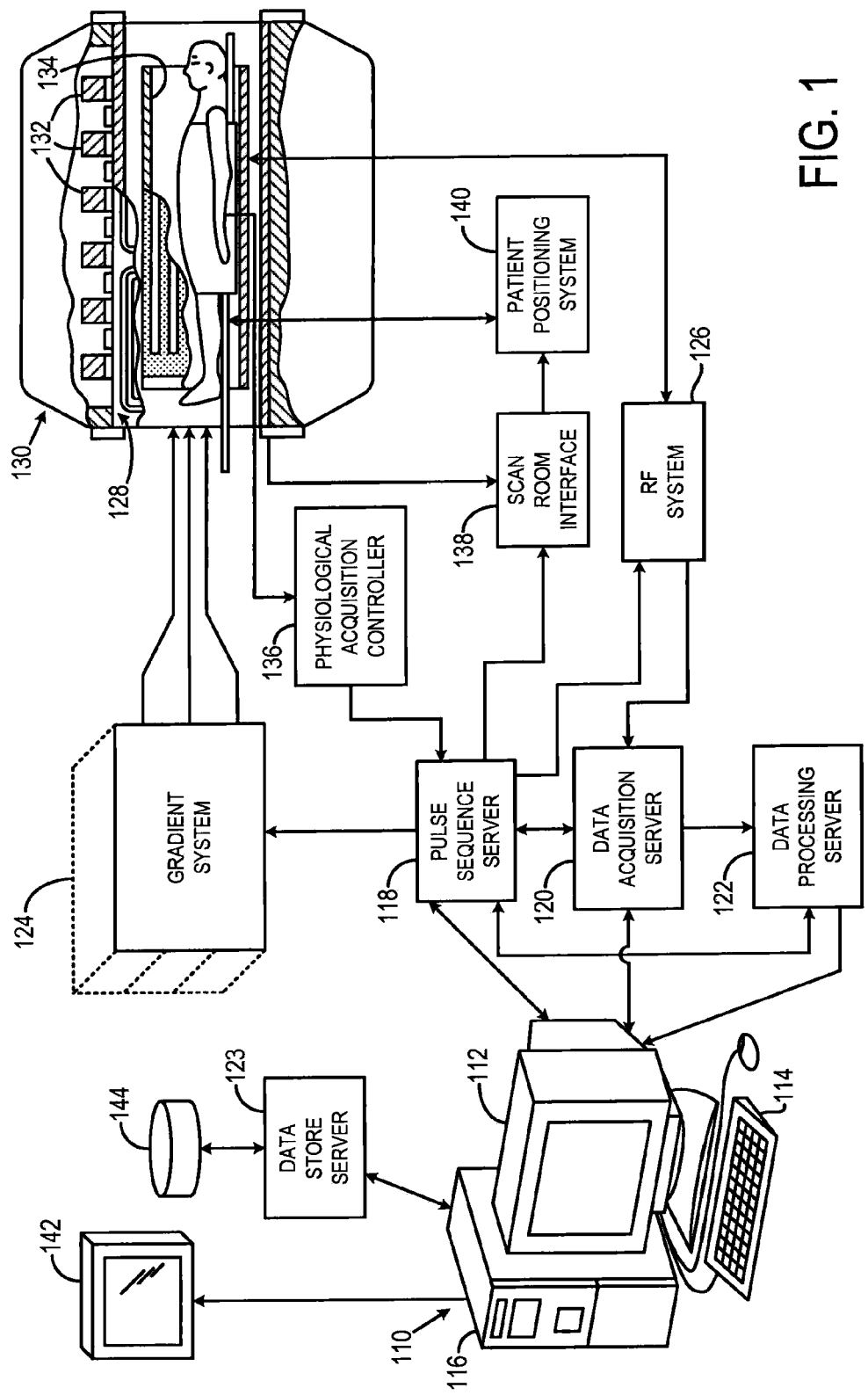
FIG. 1 is a block diagram of an MRI system that employs the present invention.

Referring particularly to FIG. 1, an embodiment of the invention is employed in a magnetic resonance imaging ("MRI") system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radiofrequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi = \tan^{-1}\left(\frac{Q}{I}\right).$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate," the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography ("MRA") scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
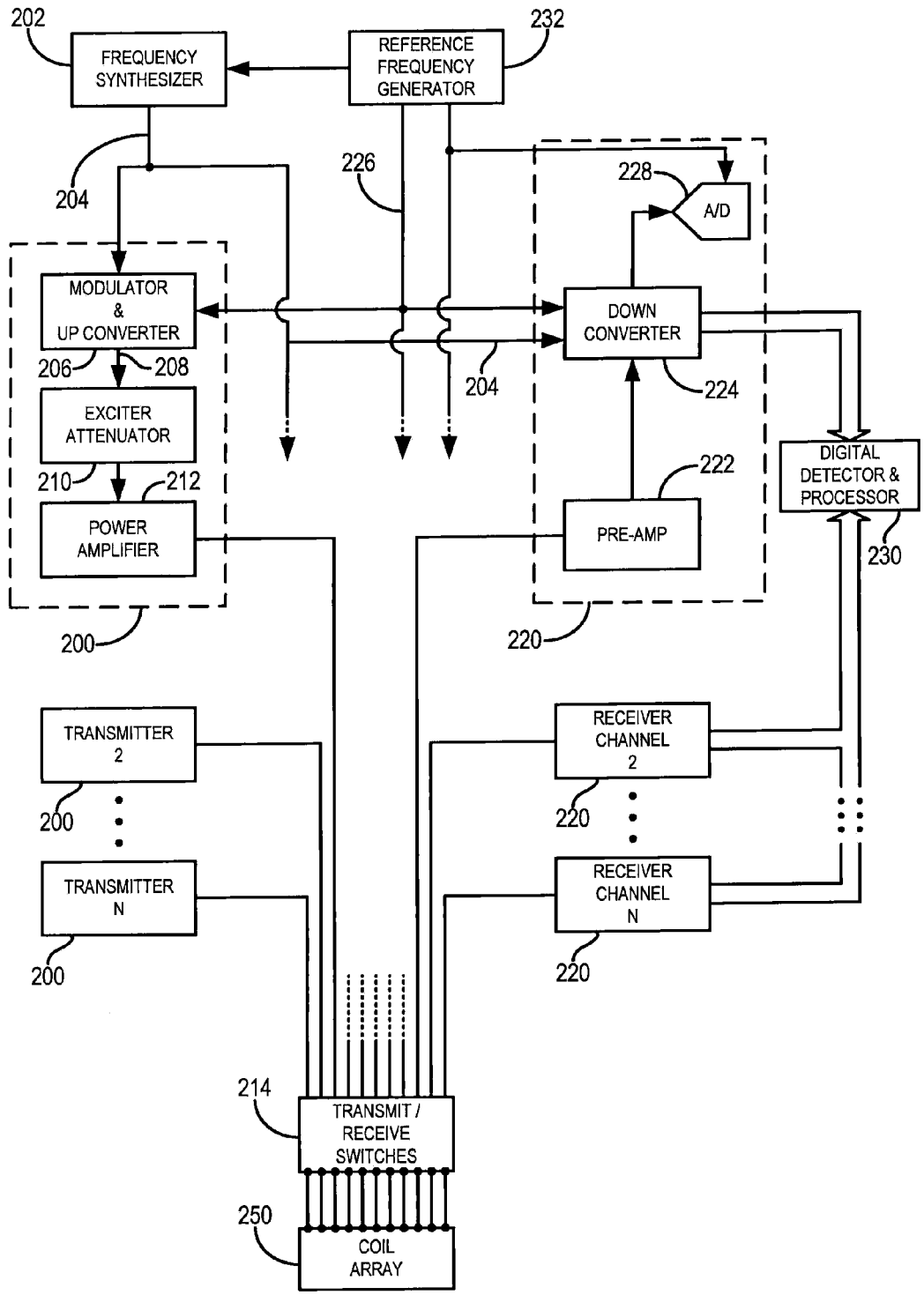
FIG. 2 is a block diagram of an RF system that forms part of the MRI system of FIG. 1.

Referring particularly to FIG. 2, the present invention employs a coil array 250 that includes a plurality of coil elements that can be separately driven by a plurality of RF transmitters to produce the prescribed RF field-of-excitation ("FOX"). The same coil array 250 can also be used with a plurality of receive channels, or in the alternative, the whole body RF coil 134 or a local RF coil can be used to acquire the MR signals. Many different coil array structures 250 may be used with the present invention, which, in part, maps the $B_1^+$ RF excitation field produced by each coil array element.

Referring particularly to FIG. 2, the RF system 126 includes a set of transmitters 200 that each produce a prescribed RF excitation field. The base, or carrier, frequency of this RF excitation field is produced under control of a frequency synthesizer 202 which receives a set of digital signals from the pulse sequence server 118. These digital signals indicate the frequency and phase of the RF carrier signal produced at an output 204. The RF carrier is applied to a modulator and up converter 206 in each transmitter 200 where its amplitude is modulated in response to a signal also received from the pulse sequence server 118. The signal defines the envelope of the RF excitation pulse to be produced and is produced by sequentially reading out a series of stored digital values. These stored digital values may, be changed to enable any desired RF pulse envelope to be produced by each transmitter 200.

The magnitude of the RF excitation pulse produced at output 208 is attenuated by an exciter attenuator circuit 210 in each transmitter 200, which receives a digital command from the pulse sequence server 118. The attenuated RF excitation pulses are applied to a power amplifier 212 in each transmitter 200. The power amplifiers are current source devices that connect to respective transmit inputs on a set of transmit/receive switches 214. By way of example, N transmitters 200 are employed and connected through N transmit/receive switches 214 to N coil elements in an RF coil array 200.

Referring still to FIG. 2 the signal produced by the subject is picked up by the coil array 200 and applied to the inputs of a set of receive channels 220. A pre-amplifier 222 in each receiver channel 220 amplifies the signal by an amount determined by a digital attenuation signal received from the pulse sequence server 118. The received signal is at or around the Larmor frequency, and this high frequency signal is down converted in a two step process by a down converter 224, which first mixes the NMR signal with the carrier signal on line 204 and then mixes the resulting difference signal with a reference signal on line 226. The down converter NMR signal is applied to the input of an analog-to-digital ("ND") converter 228 which samples and digitizes the analog signal and applies it to a digital detector and signal processor 230, which produces 16-bit in-phase ("I") values and 16-bit quadrature ("Q") values corresponding to the received signal. The resulting stream of digitized I and Q values of the received signal are output to the data acquisition server 120. The reference signal as well as the sampling signal applied to the A/D converter 228 are produced by a reference frequency generator 232.

The transmit/receive switches 214 are operated by the pulse sequence server 118 to connect the N transmitters 200 to the N coil elements in the coil array 250 during those parts of the pulse sequence in which an RF field is to be produced. Each transmitter 200 is separately controlled by the pulse sequence server 118 to produce an RF field of a prescribed amplitude, frequency, phase and envelope at each of the N coil elements. The combined RF fields of the N coil elements produce the prescribed $B_1$ field throughout the region of interest in the subject during the imaging phase of the procedure.

When the $B_1$ field is not produced the pulse sequence server 118 operates the transmit/receive switches 214 to connect each of the N receive channels to the respective N coil elements. Signals produced by excited spins in the subject are picked up and separately processed as described above.

Parallel excitation systems differ from their single-channel counterparts in that the parallel excitation systems include multiple RF excitation channels that are each capable of independent and simultaneous RF transmission. Current designs for parallel excitation systems are limited to single-frequency RF excitation with no control over RF excitation at other spectral frequencies. This is unfortunate, since there are many applications that require RF excitation to be performed well over a range of frequencies, or to excite different spatial patterns at different spectral frequency points. An example of such methods is chemical shift imaging ("CSI"). Proton chemical shift imaging gains SNR, and chemical shift dispersion benefits from higher $B_0$ field, but requires $B_1^-$ mitigation over both a specified spectral bandwidth and a spatial FOV. This additional bandwidth constraint over conventional MRI presents a challenge for previously proposed $B_1^+$ mitigation methods, which aimed at water-only excitations. It can be shown how to design a set of P RF pulses that are applied in a parallel excitation system having P transmission channels that will produce a desired spatial-spectral excitation pattern. The present invention may be employed for a conventional single RF transmit channel MRI system or with a multi-channel MRI system. The multiple-channel method will be described herein, as it will be appreciated by those skilled in the art that the extension of this method to a single-channel system can be made by setting P=1.

To begin, a small-tip-angle approximation is employed to create an approximate Fourier relationship between the energy deposited in k-space and the resulting excitation:

$$m(r) = i\gamma M_0 \sum_{p=1}^{P} S_p(r) \int_0^L b_{1,p}(t) e^{i\Delta B_0(r)(t-L)} e^{ir\cdot k(t)} dt; \qquad \text{Eqn. (1)}$$

where $\gamma$ the gyromagnetic ratio, $M_0$ is the steady-state magnetization, $m(r)$ is the approximate transverse magnetization resulting from the transmission of the RF pulses, $S_p(r)$ is the complex-valued $B_1^+$ transmit profile of the $p^{th}$ coil, $b_{1,p}(t)$ is the RF pulse played along the $p^{th}$ coil, $\Delta B_0(r)$ is a field map of $B_0$ inhomogeneity, $e^{i\Delta B_0(r)(t-L)}$ is the phase accumulation resulting from the $B_0$ inhomogeneity, $L$ is the RF pulse duration, and $$k(t) = -\gamma \int_t^L G(\tau)\,d\tau.$$

Equation (1) can be discretized in space and time to yield:

$$m = S_1 F b_1 + \ldots + S_P F b_P, \quad \text{Eqn. (2);}$$

which can alternatively be expressed as:

$$m = [S_1 F \ \ldots \ S_P F] \begin{bmatrix} b_1 \\ \vdots \\ b_P \end{bmatrix} = A_{tot} b_{tot}; \quad \text{Eqn. (3)}$$

where $S_p$ is a diagonal matrix containing $N_s$ samples of the $p^{th}$ spatial profile within a user-selected field-of-excitation ("FOX") and $b_p$ includes samples of the $p^{th}$ RF waveform, $b_{1,p}(t)$. As mentioned above, in order to produce transverse magnetization in a desired excitation pattern, d(r), with a parallel transmission system having P channels, P RF pulses are employed. Additionally, the matrix, F, incorporates the effects of the $B_0$ inhomogeneity and relates the energy deposited along a contour in k-space to the corresponding spatial location at the $N_s$ sample points where each coil is sampled. Formally:

$$F = i\gamma M_0 \Delta_t e^{i\Delta B_0(r)(t-L)} e^{ir\cdot k(t)} \quad \text{Eqn. (4);}$$

where $\Delta_t$ is the time-sample spacing of the RF waveform, $b_{1,p}(t)$. With this formulation, the RF pulses, $b_{l,p}(t)$, can be designed by solving the following MLS optimization:

$$b = \arg\!\min_b \{\||Ab| - m\|_w^2 + \beta \cdot \|b\|_2^2\} \quad \text{Eqn. (5);}$$

where $\beta \cdot \|b\|_2^2$ denotes a Tikhonov regularization term that is used to control the integrated RF power and the optimization is performed over the region-of-interest ("ROI") implied by a weighting, w. The MLS optimization, as represented by $|Ab|$ in equation (5), is used instead of a standard least-squares ("LS") optimization so that optimization occurs over the magnitude of the excitation profile, which allows for phase profile variation. However, in the alternative, a standard LS optimization may be employed.

The spectral-spatial RF excitation pulse design is a direct extension of the above formulation. To design for spatial excitation profile m at a set of N different frequencies, the set of equations is extended, and the transverse magnetization vector, m, and the A matrix are concatenated in accordance with the N design frequencies (1, 2, ..., N). The A matrix for each design frequency is calculated based on Eqn. (1), where the appropriate frequency offset is added to the $B_0$ inhomogeneity term of the equation. As a result, equation (3) takes on the form:

$$\begin{bmatrix} m_1 \\ m_2 \\ \vdots \\ m_N \end{bmatrix} = \begin{bmatrix} A_1 \\ A_2 \\ \vdots \\ A_N \end{bmatrix} \cdot b; \quad \text{Eqn. (6)}$$

Equation (6) can subsequently be solved, as before, using an MLS optimization technique with the appropriate substitutions of m and A with the corresponding matrices in Eqn. (6). The design of an RF pulse for spectral-spatial excitation is generally ill-conditioned when a conventional LS optimization method is employed because such methods require a fixed excitation phase. Therefore, an optimization method such as MLS is instead employed due to its ability to discern excitation profiles at different frequencies, which have different spatial phases.

For accurate spatial excitation in the presence of $B_0$ inhomogeneities, a $B_0$ inhomogeneity correction (e.g., $B_0$ tracking) is incorporated into the RF excitation pulse design by modifying the N individual A matrices in equation (6) to include a measured $B_0$ field map. This is achieved using a procedure similar to those described by W. Grissom, et al., in "Spatial Domain Method for the Design of RF Pulses in Multicoil Parallel Excitation," *Magn. Reson. Med.*, 2006; 56:620-629, and by K. Setsompop, et al., in "In Vivo Parallel RF Excitation with $B_0$ Correction," *Proc. Intl. Soc. Magn. Reson. Med.*, 2007; 671.

Figure 3:
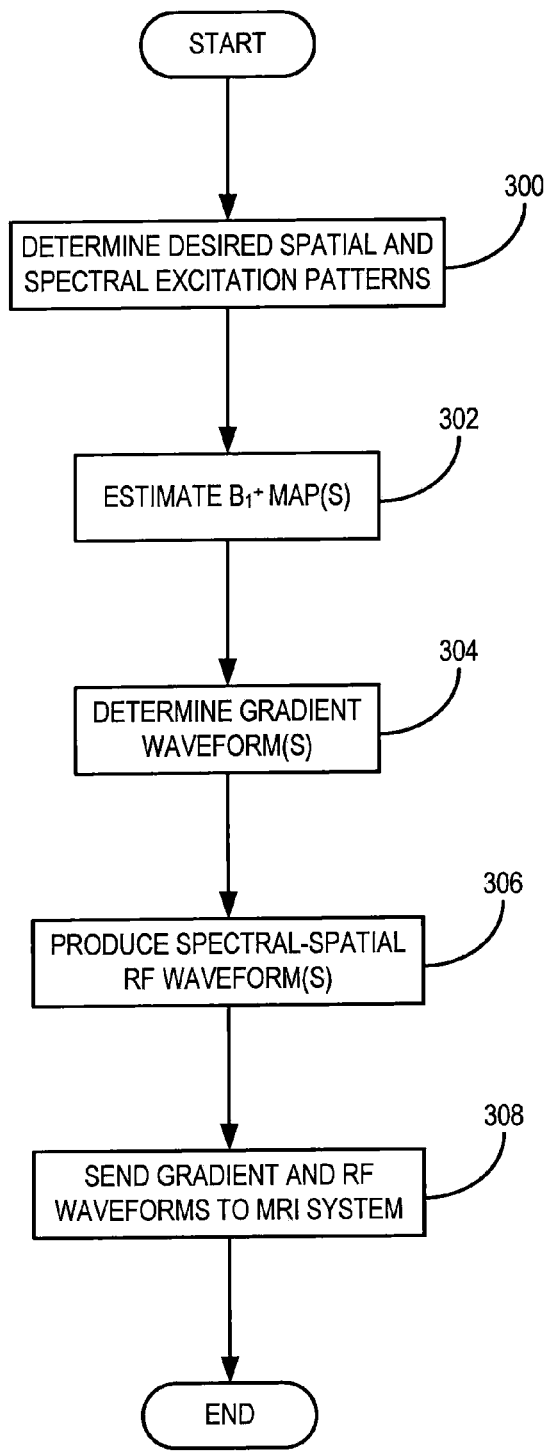
FIG. 3 is a flowchart setting for the steps of an exemplary method for determining RF waveforms in accordance with the present invention.

Referring particularly to FIG. 3, the design of a spectral-spatial RF excitation pulse in accordance with the present invention begins by determining desired spatial and spectral excitation patterns, as indicated in step 300. This is done, for example, by producing a matrix, d(r), having values indicative of the spatial extent of a desired pattern of transverse magnetization and by producing a matrix, d(f), having values indicative of a desired spectral bandwidth of a desired pattern of transverse magnetization. More specifically, the spectral excitation pattern indicates a plurality of desired resonance frequencies of spins that are to be excited in order to produce transverse magnetization. For example, a particular design might prescribe uniform spatial excitation at 0 and 100 hertz ("Hz") frequencies, and substantially no spatial excitation at 200 Hz. In another exemplary design, another type of spatial excitation pattern, such as, substantially no excitation in the top half of the imaging field-of-view and uniform excitation in the bottom half, might be prescribed for only a single spectral frequency such as 300 Hz. Next, the spatial profile of the RF transmission coil is estimated at step 302. As discussed above, in one embodiment of the present invention, a plurality of spatial profiles, $S_p(r)$, are determined when a parallel RF transmission coil array is employed. Alternatively, only one profile, $S_1(r)$, is determined when employing a single channel transmission coil. The estimation of the spatial profile, $S_p(r)$, is achieved, for example, using the estimation method described in co-pending U.S. patent application Ser. No. 12/422,017 entitled "Method for Fast Magnetic Resonance Radiofrequency Coil Transmission Profile Mapping"; however, in the alternative, other methods may be employed.

As indicated at step 304, gradient waveforms, G(t), that define the k-space locations to which RF energy is to be deposited are determined. This is done, for example, by employing a method such as the one described by S. Saekho, et al., in "Small Tip Angle Three-Dimensional Tailored Radiofrequency Slab-Select Pulse for Reduced B1 Inhomogeneity at 3T," *Magn. Reson. Med.*, 2005; 53 (2):479-484, or by Meyer, et al., in "Simultaneous Spatial and Spectral Selective Excitation," *Magn. Reson. Med.*, 1990; 15(2):287-304. As described above, these gradient waveforms define the k-space locations that, when played out in the presence of the appropriate RF excitation pulses, produce the desired excitation pattern.

A set of RF excitation waveforms that minimize the amount of RF energy required to produce the desired spatial-spectral excitation are subsequently produced, as indicated at step 306. To achieve this, equation (6) is solved by an iterative process, as described above in detail. For example, a magnitude least squares ("MLS") optimization, such as the one described in equation (5), is employed so that the magnitude of the RF energy can be improved while allowing for non-uniform phase variations. The result of employing such an optimization technique is a set of RF excitation waveforms that utilize a reduced expenditure of RF energy in order to produce a spatial-spectral excitation in accordance with the desired spatial and spectral excitation patterns established in step 300. When these RF waveforms are played out in the presence of the gradient waveforms determined in step 304, the desired spatial-spectral excitation pattern is produced. Thus, after both the gradient and RF waveforms have been determined, they are sent to the MRI system hardware, as indicated at step 308, so that they can be employed in an examination to produce the desired excitation. In this way, a reliable spatial-spectral excitation pattern is achievable with substantially suppressed effects from $B_1^+$-field inhomogeneities. In addition, spatial-spectral excitation patterns having desired performance characteristics over a prescribed spatial extent and spectral bandwidth are achievable. For example, RF excitation is produced at a certain spectral frequency while suppressing, that is, producing substantially no excitation, at another spectral frequency in accordance with a prescribed spatial pattern of excitation.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a spatially and spectrally selective radiofrequency (RF) excitation field with an RF coil that forms a part of a magnetic resonance imaging (MRI) system, the steps comprising:
    a) determining a desired spatial RF excitation pattern;
    b) determining a desired spectral RF excitation pattern;
    c) estimating an RF transmission profile map indicative of transmission characteristics of the RF coil;
    d) calculating, from the determined spatial and spectral excitation patterns and the estimated RF transmission profile map, a magnetic field gradient waveform;
    e) calculating, from the determined spatial and spectral excitation patterns, the estimated RF transmission profile map, and the calculated gradient waveform, an RF excitation pulse waveform;
    f) producing, with the MRI system, a magnetic field gradient using the calculated magnetic field gradient waveform; and
    g) producing, with the MRI system, an RF pulse using the calculated RF pulse waveform in order to produce, with the RF coil, an RF excitation field indicative of the desired spatial and spectral excitation patterns.

2. The method as recited in claim 1 in which steps f) and g) are performed substantially contemporaneously.

3. The method as recited in claim 1, further including:
    h) acquiring, with the MRI system, image data from a subject in response to the produced RF excitation field; and
    i) reconstructing an image of the subject using the acquired image data.

4. The method as recited in claim 1 in which step a) includes determining a spatial extent of the desired excitation.

5. The method as recited in claim 1 in which step b) includes determining a spectral bandwidth of the desired excitation.

6. The method as recited in claim 1 in which step b) includes determining a plurality of spectral frequencies of the desired excitation.

7. The method as recited in claim 1 in which step e) includes:
    e)i) forming a vector indicative of transverse magnetization produced by the desired spatial and spectral excitation patterns; and
    e)ii) forming a matrix that relates energy deposited at a k-space location to a corresponding spatial location on the RF coil.

8. The method as recited in claim 7 in which step e) further includes performing a magnitude least squares estimation using the vector and matrix formed in steps e)i) and e)ii), respectively.

9. The method as recited in claim 1 in which step e) includes performing a magnitude least squares estimation.

10. A non-transitory computer readable medium having stored thereon a computer program that when executed by a computer processor causes the processor to:
    a) determine a desired pattern of radiofrequency (RF) excitation by:
        a)i) selecting a desired spatial extent of the RF excitation;
        a)ii) selecting a desired spectral frequency of the RF excitation;
    b) estimate an RF transmission profile map indicative of transmission characteristics of an RF coil that forms a part of a magnetic resonance imaging (MRI) system;
    c) calculate a magnetic field gradient waveform using the determined desired pattern of RF excitation in step a) and the estimated RF transmission profile map; and
    d) calculate, using the determined desired pattern of RF excitation calculated magnetic field gradient waveform, an RF excitation pulse waveform that will produce the desired pattern of RF excitation when employed by the MRI system to produce an RF excitation pulse substantially contemporaneously with a magnetic field gradient produced by the MRI system using the calculated magnetic field gradient waveform.

11. The non-transitory computer readable medium as recited in claim 10 in which the computer processor is further caused to:
    e) direct the MRI system to acquire image data from a subject by performing a pulse sequence that includes applying a magnetic field gradient and RF excitation pulse using the respective calculated waveforms; and
    f) reconstruct an image of the subject using the acquired image data.

12. The non-transitory computer readable medium as recited in claim 10 in which the computer processor is further caused to select a desired plurality of spectral frequencies of the RF excitation in order to determine the desired pattern of RF excitation.

13. The non-transitory computer readable medium as recited in claim 10 in which the computer processor is further caused to select a desired spectral bandwidth of the RF excitation in order to determine the desired pattern of RF excitation.

14. The non-transitory computer readable medium as recited in claim 10 in which the computer processor is further caused to:
    form a magnetization vector indicative of transverse magnetization produced by the desired spatial and spectral excitation patterns; and form an energy matrix that relates energy deposited at a k-space location to a corresponding spatial location on the RF coil.

15. The non-transitory computer readable medium as recited in claim 14 in which the computer processor is caused to perform a magnitude least squares estimation using the formed magnetization vector and energy matrix in order to calculate the RF excitation pulse waveform.

16. The non-transitory computer readable medium as recited in claim 10 in which the computer processor is caused to perform a magnitude least squares estimation to calculate the RF excitation pulse waveform.

* * * * *